United States Patent
Clevenger et al.

(10) Patent No.: US 6,420,216 B1
(45) Date of Patent: Jul. 16, 2002

(54) FUSE PROCESSING USING DIELECTRIC PLANARIZATION PILLARS

(75) Inventors: Larry Clevenger, LaGrangeville; Louis L. C. Hsu, Fishkill; Chandrasekhar Narayan, Hopewell Junction; Jeremy K. Stephens, New Windsor; Michael Wise, LaGrangeville, all of NY (US)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/525,729

(22) Filed: Mar. 14, 2000

(51) Int. Cl.[7] .............................................. H01L 21/82
(52) U.S. Cl. ...................................... 438/132; 438/333
(58) Field of Search .................................. 438/128, 130, 438/132, 215, 281, 333, 467, 601

(56) References Cited

U.S. PATENT DOCUMENTS

| | | | | |
|---|---|---|---|---|
| 5,472,901 A | * | 12/1995 | Kapoor ......................... | 438/601 |
| 6,008,523 A | * | 12/1999 | Narayan et al. ............. | 257/529 |
| 6,033,939 A | * | 3/2000 | Agarwala et al. ........... | 438/132 |

* cited by examiner

Primary Examiner—David Nelms
Assistant Examiner—David Nhu
(74) Attorney, Agent, or Firm—Delio & Peterson, LLC; Peter W. Peterson; H. Daniel Schnurmann

(57) ABSTRACT

An electrical fuse structure comprises a semiconductor substrate; at least one electrically insulating layer over the semiconductor substrate having a portion thereof containing electrical wiring and another, adjacent portion thereof substantially free of electrical wiring; optionally, a further electrically insulating layer over the at least one electrically insulating layer. The electrically insulating layer(s) have a depression formed over the portion substantially free of electrical wiring, with the depression having a lower surface level than an adjacent portion of the electrically insulating layer. The fuse structure also includes a fuse insulator disposed over the depression and a fuse over the fuse insulator. Preferably, the fuse insulator is disposed only in the depression to elevate the fuse to the same level as the adjacent portion of the electrically insulating layer. The fuse structure may have a single layer or comprise alternating layers having different degrees of reflectivity to a laser beam, such as alternating layers of silicon oxide and silicon nitride. The preferred fuse structure comprises an electrically and thermally resistive fuse insulator in the depression, such that the fuse insulator substantially prevents heat of an energy beam directed at the fuse from being transmitted to the semiconductor substrate. More preferably, the fuse formed has a width less that that of the fuse insulator. The fuse structure may further include additional wiring over the electrical insulating layer at the same level as the fuse.

16 Claims, 4 Drawing Sheets

FUSE PROCESSING USING DIELECTRIC PLANARIZATION PILLARS

BACKGROUND OF THE INVENTION

1. Field of the Invention

The present invention relates to the fabrication of integrated circuits. More particularly, the present invention relates to improved techniques for increasing circuit density and/or reducing substrate damage in an integrated circuit employing fusible links.

2. Description of Related Art

Semiconductor integrated circuits (IC) and their manufacturing techniques are well known. In a typical integrated circuit, a large number of semiconductor devices may be fabricated on a silicon substrate. To achieve the desired functionality, a plurality of conductors are typically provided to couple selected devices together. In some integrated circuits, conductive links are coupled to fuses, which may be cut or blown after fabrication using lasers or electrical power. In a dynamic random access memory (DRAM) circuit, for example, fuses may be employed during manufacturing to protect some of the transistors' gate stacks from an inadvertent built-up of charges. Once fabrication of the IC is substantially complete, the fuses may be blown or cut to permit the DRAM circuit to function as if the protective current paths never existed. Alternatively, the fuse links may be used to re-route the conductive lines and hence modify the functionality of the circuit.

Laser fusible links are generally metal lines that can be explosively fused open by application of laser energy. The laser energy causes a portion of the link material to vaporize and a portion to melt. Typically, the fusible link is thin and is made of aluminum or polysilicon or it may be made of the same metals as the chip conductors. In operation, a short pulse of laser energy in predetermined arcs (spot) is impinged upon the link. Electrically fusible links comprise metal lines that can be fused open by application of excess electrical current through the fuse which induces a portion of the link material to vaporize, melt or otherwise be caused to form an electrical discontinuity or "open". Typically, the electrically fusible link is formed of a metallic conductor (such as aluminum) or a polysilicon. In operation, a short pulse of electrical power is applied to induce the fuse open.

Since every link is not necessarily blown, it is important to ensure that adjacent fuses are not blown by reflected light or thermal energy. Two methods are currently used to ensure that only the desired fuses are blown and that adjacent fuses are not inadvertently blown. The first method simply spaces the fuses two or three spot diameters apart. The second method builds metal walls between the adjacent fuses. Both those methods result in large fuse pitches and significant use of chip area. In cases where the fusible links are built from the same material as the chip conductors; become thicker; are made of composite layers including layers of refractory metals (tungsten and various silicides); or are comprised of highly reflective metals (copper/aluminum), blowing the fuses with lasers becomes more difficult. The increasing speed requirements of logic chips are the driving force behind these fusible link materials. More commonly, fuses may be employed to set the enable bit and the address bit of a redundant array element in a DRAM circuit.

It has been found that the use of a laser beam to set, cut or blow a fuse link may render the area under the fuse link or adjacent fusible links vulnerable to laser-induced damage, mainly due to the absorption of laser energy during the fuse setting operation. Because of the possibility of laser-induced damage, the areas underlying the fuse links are typically devoid of semiconductor devices (e.g., transistors) and the fuses are spaced far apart in conventional systems. Even when there are no active devices beneath the fusible link or other closely spaced fusible links, the substrate itself may also experience some degree of laser-induced damage. This is because silicon, which is the typical substrate material, absorbs the laser energy readily, particularly when short wavelength lasers are employed. For this reason, lasers having relatively long wavelengths such as infrared lasers have been employed in conventional systems for the fuse setting operation.

Even though infrared lasers are helpful in minimizing laser-induced damage to the underlying substrate, the use of lasers having relatively long wavelengths involves certain undesirable compromises. By way of example, the relatively long wavelength of the infrared laser forms a relatively large spot on the substrate during the fuse setting operation, which limits how closely the fuse links can be packed next to one another. For infrared lasers having a wavelength of, for example, about 1 micron, the spot created on the substrate may be two times the wavelength of about 2 to 2.5 microns wide. The diameter of the laser spot places a lower limit on the minimum fuse pitch or spacing between adjacent fuse links. If the fuses are placed too closely together for a given laser wavelength, an adjacent fuse link may be inadvertently blown or cut, rendering the IC defective.

Using a laser with a shorter wavelength would reduce the diameter of the laser spot and concomitantly the minimum fuse pitch. However, a shorter wavelength laser substantially increases the likelihood of underlying substrate damage in conventional systems since the silicon substrate absorbs laser energy from shorter wavelength lasers more readily. If a shorter wavelength laser is employed to set the fuse links of the conventional system's fuse array, excessive substrate damage in area may result, possibly leading to integrated circuit defects and failure.

There is a need for improved techniques for fabricating integrated circuits having laser and or electrically fusible links. More particularly, there is a conventional need for improved laser and/or electrical fuse link structures and methods therefor, which reduce the amount of damage caused when the fuse element blows.

Bearing in mind the problems and deficiencies of the prior art, it is therefore an object of the present invention to provide an improved method for fabricating integrated circuits having laser fusible links.

It is another object of the present invention to provide an improved laser fuse link structure which reduces the amount of damage caused when the fuse element blows.

A further object of the invention is to provide an improved fuse link structure and method of making such a structure which permits the fuses to have smaller spacing and pitch.

It is yet another object of the present invention to provide an improved fuse link structure and method of making such a structure which permits the fuses to be blown with short or long wavelength lasers.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an electrical fuse structure comprising a semiconductor substrate; at least one electrically insulating layer over the semiconductor substrate having a portion thereof containing electrical wiring and another, adjacent portion thereof substantially free of electrical wiring; optionally, a further electrically insulating layer over the at least one electrically insulating layer. The at least one electrically insulating layer and the optional further electrically insulating layer have a depression formed over the portion of the at least one electrically insulating layer substantially free of electrical wiring, with the depression having a lower surface level than an adjacent portion of the electrically insulating layer. The fuse structure also includes a fuse insulator disposed over the depression and a fuse over the fuse insulator.

Preferably, the fuse insulator is disposed only in the depression to elevate the fuse to the same level as the adjacent portion of the electrically insulating layer. The fuse structure may have a single layer or comprise alternating layers having different degrees of reflectivity to a laser beam, such as alternating layers of silicon oxide and silicon nitride. The preferred fuse structure comprises an electrically and thermally resistive fuse insulator in the depression, such that the fuse insulator substantially prevents heat of an energy beam directed at the fuse from being transmitted to the semiconductor substrate. More preferably, the fuse formed has a width less that that of the fuse insulator. The fuse structure may further include additional wiring over the electrical insulating layer at the same level as the fuse.

In a related aspect, the present invention provides an electrical fuse structure comprising a semiconductor substrate; a first electrically insulating layer over the semiconductor substrate having a portion thereof containing electrical wiring and another, adjacent portion thereof substantially free of electrical wiring; and a second electrically insulating layer over the first electrically insulating layer. The first electrically insulating layer and the second electrically insulating layer have a depression formed over the portion of the at least one electrically insulating layer substantially free of electrical wiring, with the depression having a lower surface level than an adjacent portion of the electrically insulating layer. An electrically and thermally resistive fuse insulator is disposed over the depression in the second electrically insulating layer, where the fuse insulator has a width and having a surface level which is substantially the same as that of the adjacent surface level of the second electrically insulating layer. A fuse is disposed over the fuse insulator, with the fuse having a width less that that of the fuse insulator. The fuse insulator may comprise alternating layers having different degrees of reflectivity to a laser beam, such as alternating layers of silicon oxide and silicon nitride.

In yet another aspect, the present invention relates to a method of forming an electrical fuse on a semiconductor structure comprising providing a semiconductor substrate; depositing on the semiconductor substrate at least one electrically insulating layer having a portion thereof containing electrical wiring and another, adjacent portion thereof substantially free of electrical wiring; and polishing the at least one electrically insulating layer, e.g., by chemical mechanical polishing, such that there is formed over the portion thereof substantially free of electrical wiring a depression having a lower surface level than the adjacent portion thereof containing electrical wiring. Optionally, there is deposited over the at least one electrically insulating layer a further electrically insulating layer. The method includes polishing the further electrically insulating layer such that there is formed therein over the portion of the at least one electrically insulating layer substantially free of electrical wiring a depression having a lower surface level than an adjacent portion of the further electrically insulating layer. The method then includes depositing a fuse insulator in the depression over the portion of the at least one electrically insulating layer substantially free of electrical wiring, with the fuse insulator having a surface level which is substantially the same as the adjacent surface level of the electrically insulating layer; and forming a fuse over the fuse insulator.

Preferably, the fuse insulator is electrically and thermally resistive and is deposited only in the depression and the method comprises depositing alternating layers, such as layers of silicon oxide and silicon nitride, having different degrees of reflectivity to a laser beam. The method may further including directing an energy beam at, and blowing, the fuse. The fuse formed preferably has a width less that that of the fuse insulator, such that when directing an energy beam having a width greater than the fuse at the fuse, a portion of the energy beam blows the fuse and another portion of the energy beam is reflected by the fuse insulator. The fuse insulator substantially prevents heat from being transmitted to the semiconductor substrate. The method may further include depositing additional wiring over an electrical insulating layer at the same level as the fuse.

A further aspect of the present invention provides a method of forming an electrical fuse on a semiconductor structure comprising providing a semiconductor substrate; depositing on the semiconductor substrate a first electrically insulating layer having a portion thereof containing electrical wiring and another, adjacent portion thereof substantially free of electrical wiring; depositing over the electrically insulating layer a second electrically insulating layer; and chemical mechanical polishing the second electrically insulating layer such that there is formed therein over the portion of the first electrically insulating layer substantially free of electrical wiring a depression having a lower surface level than an adjacent portion of the second electrically insulating layer over the portion of the first electrically insulating layer containing electrical wiring. The method then includes depositing an electrically and thermally resistive fuse insulator in the depression of the second electrically insulating layer, the fuse insulator having a width and having a surface level which is substantially the same as the adjacent surface level of the second electrically insulating layer; forming a fuse over the fuse insulator, the fuse having a width less that that of the fuse insulator; and directing a laser beam at, and blowing, the fuse.

Preferably, depositing the fuse insulator comprises depositing alternating layers having different degrees of reflectivity to the laser beam. The method may further include directing a laser beam having a width greater than the fuse at the fuse such that a portion of the laser beam blows the fuse and another portion of the laser beam is reflected by the fuse insulator. The fuse insulator substantially prevents heat from being transmitted to the semiconductor substrate. Additional wiring may be deposited over the adjacent surface level of the second electrical insulating layer at the same level as the fuse.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

Figure 1:
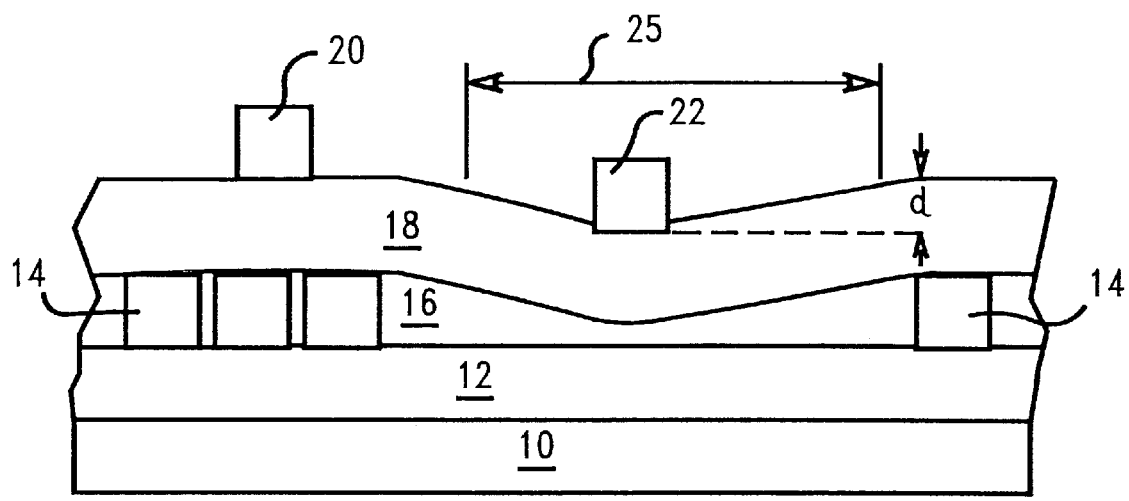
FIG. 1 is an elevational cross-sectional view of an integrated circuit chip showing the problems encountered in making fuse structures in accordance with current, prior art processing.

In describing the preferred embodiment of the present invention, reference will be made herein to FIGS. 1–6 of the drawings in which like numerals refer to like features of the invention. Features of the invention are not necessarily shown to scale in the drawings.

Laser assisted fusing is the industry standard for activating redundancy in semiconductor chips, especially in DRAMs. As the fuse dimensions and pitches reduce, the fusing process window starts to diminish. It has been found that the reduction in the process window is driven by two causes. One cause is that fuses and other wiring on the same metal level are often not coplanar, thereby making lithography an issue. A second cause is that the spot size of the laser is large for presently used systems, which therefore limits the proximity of neighboring fuses. The present invention addresses both problems in providing the improved fuse structure and fabrication method herein.

FIG. 1 shows a substrate 10, typically Si or other semiconductor material, on which an insulator layer 12 is deposited. The structures herein described are formed by conventional lithographic processing, unless otherwise described. Substrate layer 12 is typically between 200 nm and 800 nm in thickness. A metal wiring layer 14 is formed on substrate 12 and is surrounded by electrical insulator layer 16. The metal layer thickness is typically 200–600 nm, after polishing to attempt to planarize the layer. The next insulator level 18, similar in thickness to the previous layer 12 is then deposited and polished. The area on which the fuse is to be subsequently placed, i.e., the fuse window, is indicated by width dimension 25. No metal features are typically allowed in the fuse window. The chemical-mechanical polishing (CMP) of insulator layers below the fuse level causes topography to be introduced due to dishing. This dishing results in metal islands that can result in shorts in the subsequent levels. Because of the absence of metal wiring, polishing leads to a depression at the insulation layers in the fuse window. The depth of this depression d is typically in the range 5 nm to 300 nm depending on the size (width) of the fuse window being polished.

Subsequently, when the next metal level is defined, wiring 20 on the flat regions on insulator layer 18 and fuse 22 in the depressed areas are not co-planar. This fuse metal level difference, equal to depression depth d, is typically 200 to 500 nm if an interior metal level is used, or can be as large as 1200 nm if the last metal is used as the fuse layer. In addition to causing lithographic problems, this fuse layer height difference also affects the blow characteristics because the wafer level alignment marks are coplanar with wiring and not with the fuses 22, leading to a laser focusing problem. Additional insulator thickness from subsequent dielectric layers deposited over fuse 22, as compared to insulator thickness over wiring 20, also contributes to problems in accurately blowing the fuses by use of a laser beam without damage to other components and areas.

The present invention teaches a structure and method to overcome this drawback. To address the issue of excessive spot size, the problem can be reduced by going to smaller wavelength lasers, but this is generally not possible due to the strong absorption of the laser energy by the Si substrate at wavelengths below 1 $\mu$m. The present invention also teaches a structure to overcome this shortcoming.

Figure 2:
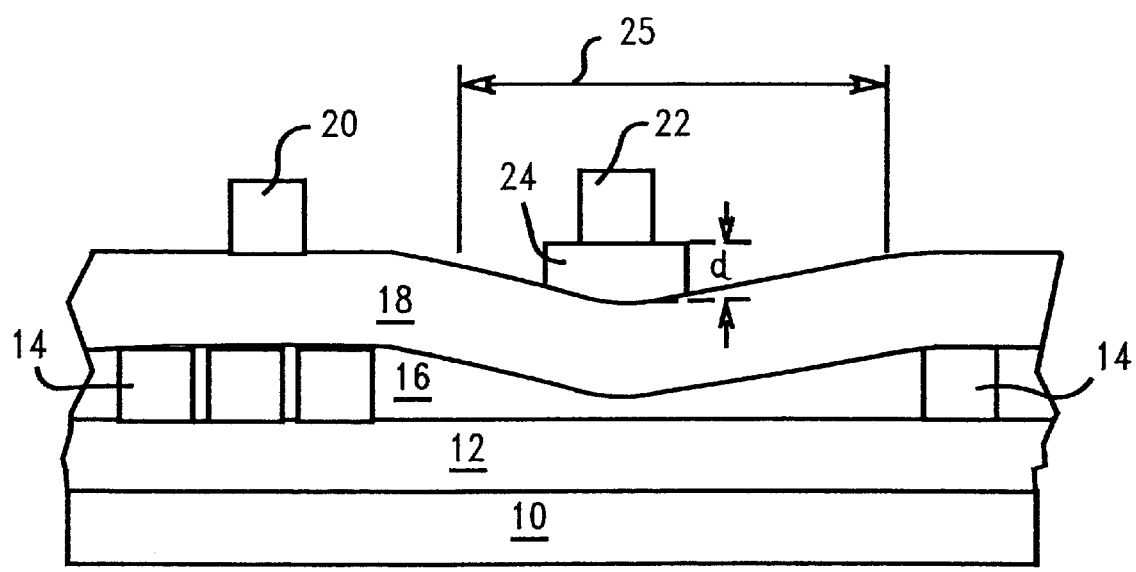
FIG. 2 is an elevational cross-sectional view of an integrated circuit chip showing one embodiment of the method of making fuse structures in accordance with the present invention.

In the first preferred embodiment depicted in FIG. 2, a single block or pillar structure is used under each fuse or as a block under the whole fuse bank that elevated the fuse to the level of the rest of the wiring on that level. FIG. 2 shows substrate 10 on which an insulator layer 12 is deposited. A metal wiring layer 14 is built on layer 12 and is surrounded by insulator 16, which is then polished, e.g., by chemical-mechanical polishing. The next insulator level 18 is then deposited and polished. Because no metal features are allowed inside fuse window 25, the polishing leads to a depression inside the fuse window. A layer of insulator is then deposited on layer 18 and patterned to form a pillar or pedestal 24 within the depression at fuse window 25 as shown in FIG. 2. The width of this pedestal should typically be approximately the same as the beam diameter for laser system employed. For standard fuse blow systems in use today, the laser spot size is of the order of 3 $\mu$m. The pedestal dimensions should therefore preferably be approximately 3 $\mu$m on a side. The height of the pedestal should preferably be about the same as the depth d of the depression in fuse window 25. Subsequently, when the next metal level is defined, wiring 20 deposited on the flat regions of layer 18 and fuse 22 deposited on pedestal 24 in the depressed fuse window area 25 are now co-planar. This solution eliminates both the lithographic problems and also problems arising from focusing of the laser system during fusing.

Currently, the laser wavelength used for fuse blow is limited to about 1.04–1.31 $\mu$m to avoid the absorption of laser energy by the silicon substrate resulting in substrate damage. This fact, combined with an effective laser spot size of about 2.5 times the laser wavelength, limits the fuse pitch with current technologies to greater than 2.2 $\mu$m. To get to a tighter fuse pitch, the present invention permits a smaller laser wavelength to be used and prevents the laser energy from reaching the silicon substrate. To accomplish this, pedestal 24 may be made as a refractory, thermally insulating, metal shield below the fuse, e.g., a molybdenum/tungsten shield below fuse 22. Alternatively, planarization pillar 24 may comprise a dielectric arc layer-like silicon-oxynitride (i.e., $SiO_xN_y$), so that any laser light that gets by fuse 22 during fuse blow will be absorbed by the pillar 24 and not be absorbed by the silicon substrate. The proper layer thickness may be determined without undue experimentation to prevent excessive absorption causing local damage.

Figure 3:
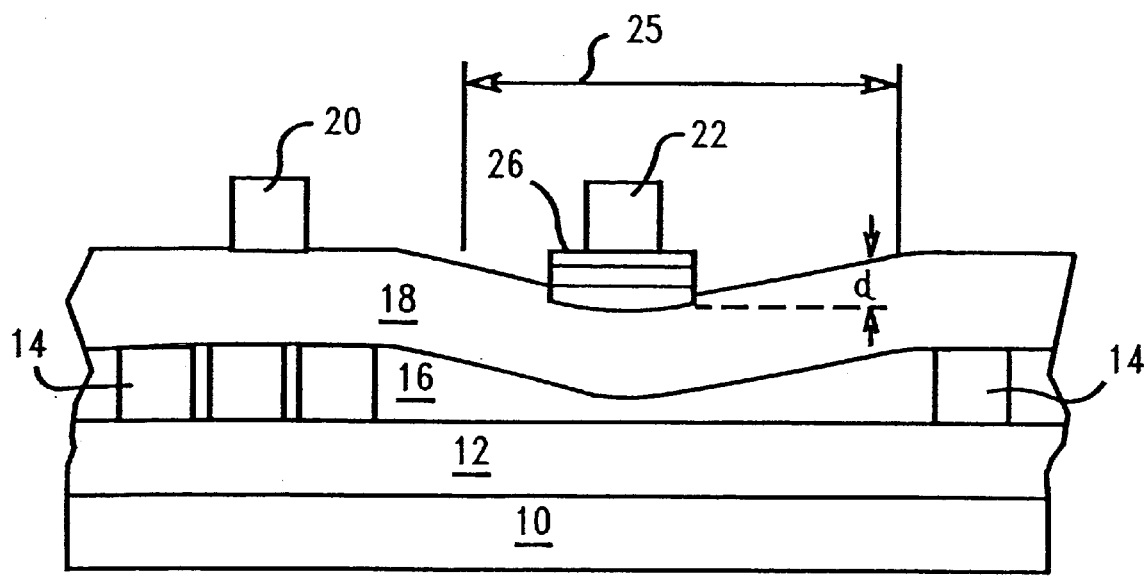
FIG. 3 is an elevational cross-sectional view of an integrated circuit chip showing another embodiment of the method of making fuse structures in accordance with the present invention.
Figure 4:
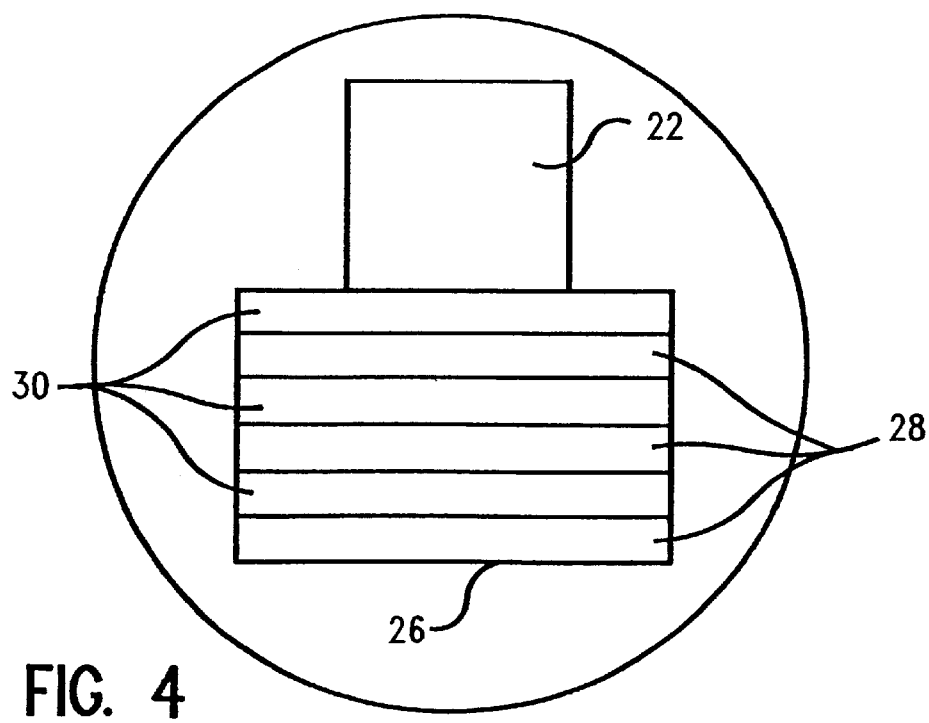
FIG. 4 is an expanded view of the fuse portion of FIG. 3.

A further preferred embodiment is shown in FIGS. 3 and 4. This second embodiment further extends the previous embodiment to also facilitate the use of lower wavelength lasers that are presently unusable since they are strongly absorbed by the semiconductor substrate. The commercial fusing systems available today typically use lasers of wavelength between 1 and 1.4 μm. To enable fuse pitches below 2 μm it is necessary to migrate to lasers with wavelengths in the UV to green range (~200 to ~500 nm). At these wavelengths the substrate is so strongly absorbing that it is generally impossible to blow the fuse without serious damage to the underlying substrate. In the modification to the first preferred embodiment, the dielectric pillar or pedestal may be comprised of a tailored multi-layer composite.

FIG. 3 shows a substrate 10 on which an insulator layer 12 is deposited. A metal wiring layer 14 is built on layer 12 and is surrounded by insulator 16. The next insulator level 18 is then deposited and polished. Because no metal features are allowed inside the fuse window 25, the polishing leads to a depression inside the fuse window. A multi-layer composite structure 26 is then deposited and patterned to form pillars or pedestals at locations shown in the figure. Once again it is preferable that the pillar be about as large in width as the laser spot size, and as high as the depth of the depression in the upper surface of layer 18. In this case where lower wavelength lasers are to be used, it may be possible to reduce the pillar size to be about 2 μm on a side. As before, the height of the pillar is designed to elevate the fuse 22 to the level of the rest of wiring, 20 formed on level 18.

In the magnified portion of the pillar shown in FIG. 4, the multi-level composite structure is shown as alternating layers of materials 28 and 30. The materials 28 and 30 are so chosen that their combination results in the stack having controlled laser beam energy transmission or reflectance, as desired. Multi-layered structures with controlled optical properties are known in connection with other applications, and their desired properties may be easily determined without undue experimentation. For example, the planarization pillar 26 may be made up of alternating layers with different laser reflectivity N and thermal insulation K values, so that a majority of the laser light can be reflected away from the silicon substrate.

Figure 5:
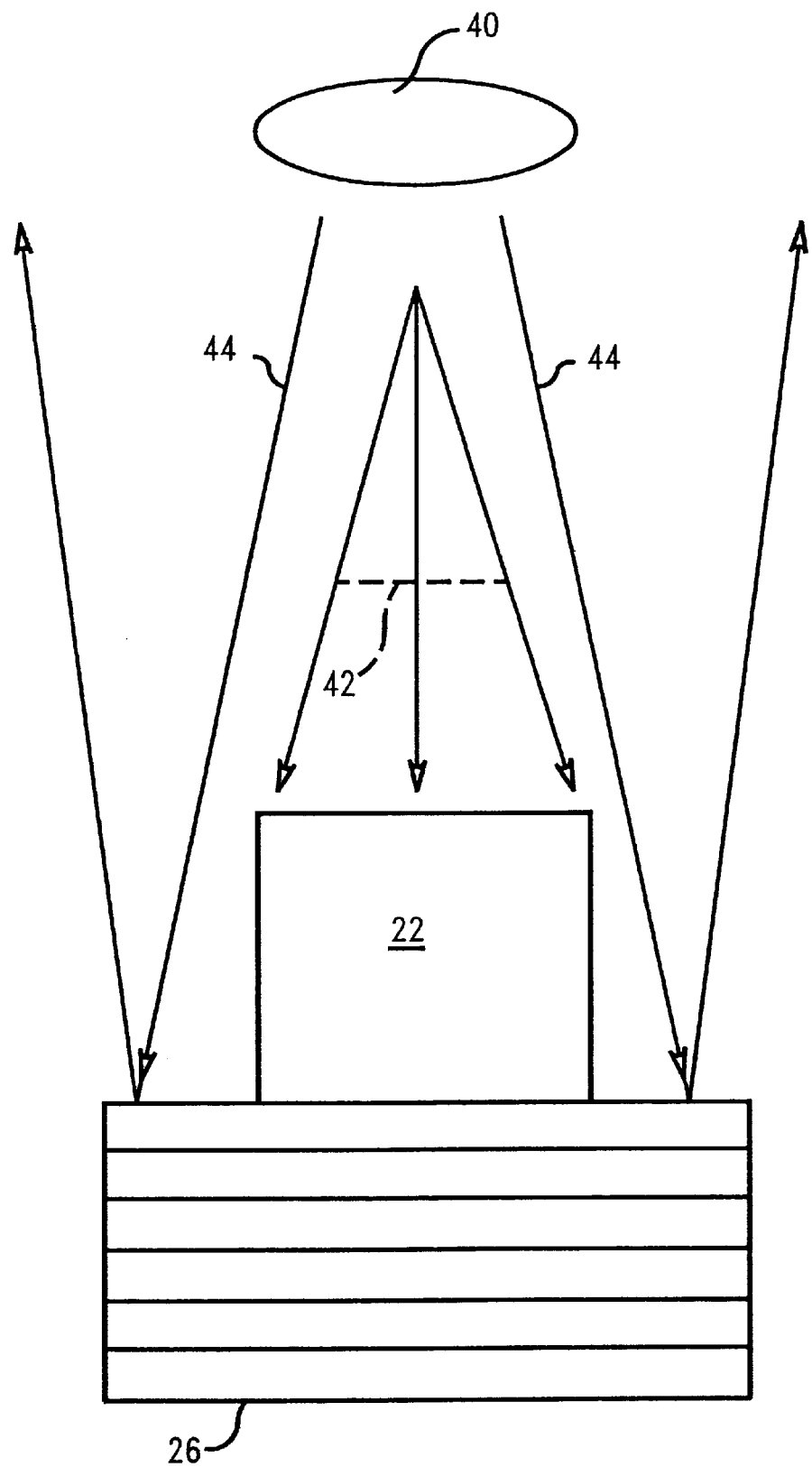
FIG. 5 is an elevational cross-sectional view of an integrated circuit chip showing one embodiment of the method of blowing the fuse structures made in accordance with the present invention.

In this embodiment, the materials are chosen such that the laser energy that falls on the pillar is reflected to prevent damage to the underlying semiconductor substrate 20. This is seen in FIG. 5 where 40 represents the final lens in the laser system that directs the light on to the fuse to blow the fuse. The portion of laser light beam 42 that falls on the fuse link goes to ablate the fuse, while the portion of the beam 44 that falls outside the dimensions of the fuse are primarily reflected back, thus protecting the substrate below.

In a more preferred embodiment, the multi-level pillar stack 26 is comprised of alternating layers of $SiO_2$ and $Si_3N_4$ (FIG. 4). The thickness of each layer should be a quarter of the laser wavelength. For a 300 nm laser, each layer in this bilayer stack should be approximately 75 nm thick, corrected for refractive index. (The exact thickness will be 75 nm divided by the refractive index of that layer.) For a system designed to be fused with a 300 nm laser, the bi-layer stack will need to be made up of about 49 nm of oxide followed by 39 nm of nitride. These films can be deposited in-situ in a chemical vapor deposition chamber where the thickness of the films can be controlled precisely. For one bi-layer the reflectivity value N is about 45%. For two bilayers the total reflectivity increases to nearly 70%. For polishing related depressions that are typically seen in the fuse windows, it may be necessary to use between 1 and 4 bilayers. The 4 bilayer stack will give a reflectivity of greater than 80%. Typical dishing due to a polishing operation results in a depression of between about 30 nm and 120 nm in depth. This will translate to a single bilayer scheme with the proposed $SiO_2$ and $Si_3N_4$ material set. Other combinations of transparent insulators will permit different number bi-layers to make up for the polishing dishing.

Figure 6:
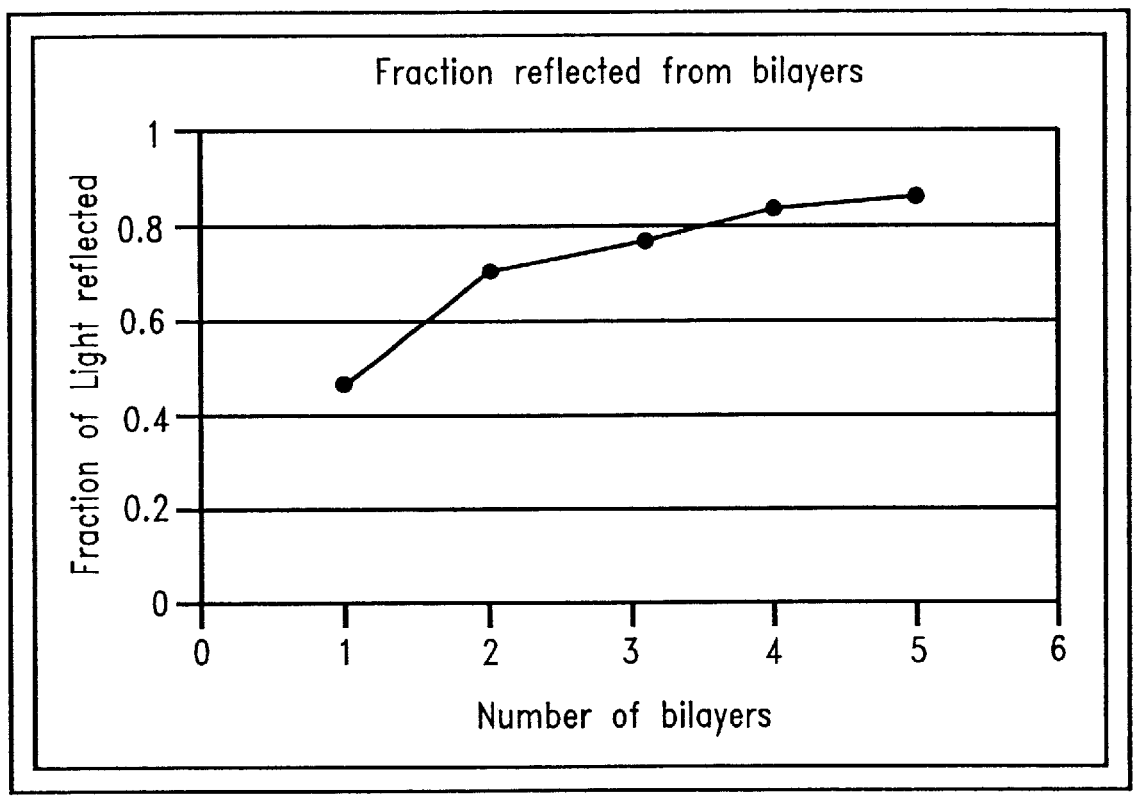
FIG. 6 is a graphical representation showing laser energy reflectance by the fuse structure of the present invention.

FIG. 6 shows a graphical representation of the amount of the incident laser light reflected as a function of the number of bilayers of $SiO_2$ (thickness 49 nm) and $Si_3N_4$ (thickness 39 nm) when a 300 nm laser is used for fusing. In this preferred embodiment both drawbacks of prior art processing, i.e., lack of co-planarity and problems in laser wavelength reduction, are addressed and resolved.

Thus, the present invention achieves the objects set forth above. The invention provides an improved method for fabricating integrated circuits having laser fusible links which reduces the amount of damage caused when the fuse element blows. The present invention permits the fuses to be blown with short or long wavelength lasers. In particular, the prevention of the laser energy from reaching the silicon substrate by its absorption or reflection will allow for shorter wavelength lasers to be used for fuse blow which will allow for tighter fuse pitches.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming an electrical fuse on a semiconductor structure comprising:

providing a semiconductor substrate;

depositing on said semiconductor substrate at least one electrically insulating layer having a portion thereof containing electrical wiring and another, adjacent portion thereof substantially free of electrical wiring;

polishing said at least one electrically insulating layer such that there is formed over the portion thereof substantially free of electrical wiring a depression having a lower surface level than the adjacent portion thereof containing electrical wiring;

optionally depositing over said at least one electrically insulating layer a further electrically insulating layer and polishing said further electrically insulating layer such that there is formed therein over the portion of said at least one electrically insulating layer substantially free of electrical wiring a depression having a lower surface level than an adjacent portion of the further electrically insulating layer;

depositing a fuse insulator in the depression over the portion of said at least one electrically insulating layer substantially free of electrical wiring, the fuse insulator having a surface level which is substantially the same as the adjacent surface level of the electrically insulating layer; and forming a fuse over said fuse insulator.

2. The method of claim 1 wherein said fuse insulator is deposited only in said depression.

3. The method of claim 1 wherein depositing the fuse insulator comprises depositing alternating layers having different degrees of reflectivity to a laser beam.

4. The method of claim 1 wherein the fuse insulator has a width, and wherein the fuse formed has a width less that that of the fuse insulator.

5. The method of claim 1 wherein depositing the fuse insulator comprises depositing alternating layers of silicon oxide and silicon nitride.

6. The method of claim 1 wherein the polishing comprises chemical mechanical polishing.

7. The method of claim 1 further including directing an energy beam at, and blowing, said fuse.

8. The method of claim 1 further including directing an energy beam having a width greater than said fuse at said fuse such that a portion of said energy beam blows said fuse and another portion of said energy beam is reflected by said fuse insulator.

9. The method of claim 1 comprising depositing an electrically and thermally resistive fuse insulator in said depression.

10. The method of claim 1 further including directing an energy beam at said fuse such that said fuse insulator substantially prevents heat from being transmitted to said semiconductor substrate.

11. The method of claim 1 further including depositing additional wiring over an electrical insulating layer at the same level as said fuse.

12. A method of forming an electrical fuse on a semiconductor structure comprising:

providing a semiconductor substrate;

depositing on said semiconductor substrate a first electrically insulating layer having a portion thereof containing electrical wiring and another, adjacent portion thereof substantially free of electrical wiring;

depositing over said electrically insulating layer a second electrically insulating layer;

chemical mechanical polishing said second electrically insulating layer such that there is formed therein over the portion of said first electrically insulating layer substantially free of electrical wiring a depression having a lower surface level than an adjacent portion of the second electrically insulating layer over the portion of the first electrically insulating layer containing electrical wiring;

depositing an electrically and thermally resistive fuse insulator in the depression of the second electrically insulating layer, the fuse insulator having a width and having a surface level which is substantially the same as the adjacent surface level of the second electrically insulating layer;

forming a fuse over said fuse insulator, said fuse having a width less that of the fuse insulator; and directing a laser beam at, and blowing, said fuse.

13. The method of claim 12 wherein depositing the fuse insulator comprises depositing alternating layers having different degrees of reflectivity to said laser beam.

14. The method of claim 12 further including directing a laser beam having a width greater than said fuse at said fuse such that a portion of said laser beam blows said fuse and another portion of said laser beam is reflected by said fuse insulator.

15. The method of claim 12 further including directing a laser beam at said fuse such that said fuse insulator substantially prevents heat from being transmitted to said semiconductor substrate.

16. The method of claim 12 further including depositing additional wiring over the adjacent surface level of said second electrical insulating layer at the same level as said fuse.

* * * * *